(12) United States Patent
Harper

(10) Patent No.: US 7,928,884 B2
(45) Date of Patent: Apr. 19, 2011

(54) ANALOG-TO-DIGITAL CONVERTER WITH A BALANCED OUTPUT

(75) Inventor: Marcellus C. Harper, Kaysville, UT (US)

(73) Assignee: SiFlare, Inc., Sandy, UT (US)

( * ) Notice: Subject to any disclaimer, the term of this patent is extended or adjusted under 35 U.S.C. 154(b) by 17 days.

(21) Appl. No.: 12/409,256

(22) Filed: Mar. 23, 2009

(65) Prior Publication Data
US 2009/0179788 A1 Jul. 16, 2009

Related U.S. Application Data

(63) Continuation-in-part of application No. 12/013,039, filed on Jan. 11, 2008.

(60) Provisional application No. 61/038,841, filed on Mar. 24, 2008.

(51) Int. Cl.
*H03M 1/12* (2006.01)

(52) U.S. Cl. ...................................... 341/155; 341/156
(58) Field of Classification Search .................. 341/155, 341/156, 120; 398/182, 197; 372/138.04
See application file for complete search history.

(56) References Cited

U.S. PATENT DOCUMENTS

| 4,486,739 | A | 12/1984 | Franaszek et al. | |
|---|---|---|---|---|
| 6,310,570 | B1 * | 10/2001 | Rumreich et al. | 341/155 |
| 6,654,565 | B2 * | 11/2003 | Kenny | 398/182 |
| 6,836,510 | B2 * | 12/2004 | Young et al. | 375/222 |

* cited by examiner

*Primary Examiner* — Joseph Lauture
(74) *Attorney, Agent, or Firm* — Steven L. Nichols; Van Cott, Bagley, Cornwall & McCarthy P.C.

(57) ABSTRACT

An Analog-to-Digital Converter (ADC) includes analog to digital conversion circuitry configured to receive an analog signal and output a digital representation of the analog signal on a plurality of data lines; a balancing circuit configured to encode the digital representation of the analog signal on the data lines such that a total number of 1's and 0's transmitted on any given data line is the same.

10 Claims, 4 Drawing Sheets

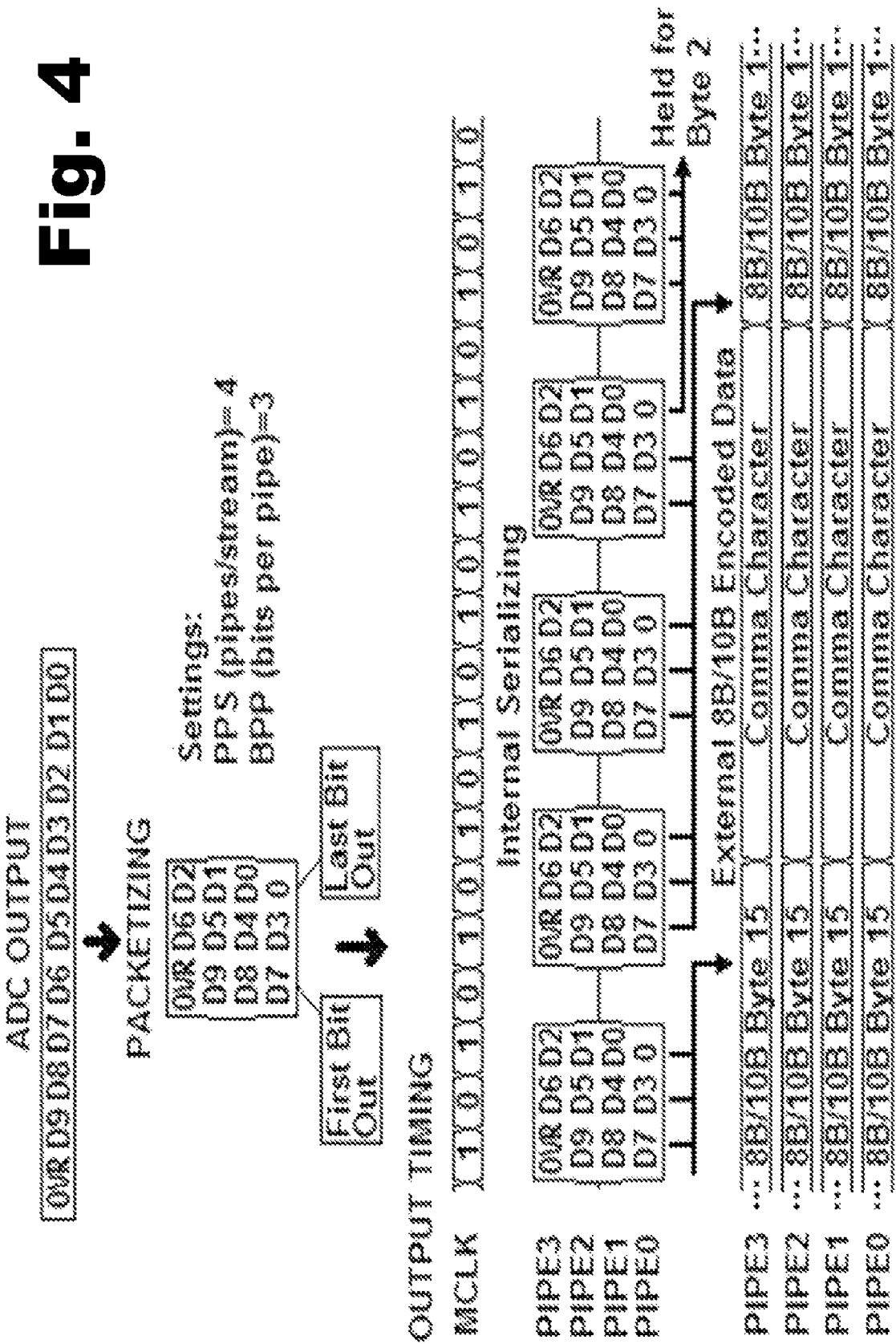

ANALOG-TO-DIGITAL CONVERTER WITH A BALANCED OUTPUT

RELATED APPLICATIONS

The present application claims the priority under 35 U.S.C. §119(e) to U.S. Provisional Application No. 61/038,841, by Marcellus C. Harper, filed on Mar. 24, 2008, and entitled "An Analog-to-Digital Converter with a Balanced Output," which application is hereby incorporated by reference in its entirety.

The present application is also a continuation-in-part, and claims the benefit under 35 U.S.C. §120 of U.S. patent application Ser. No. 12/013,039, by Marcellus C. Harper, filed on Jan. 11, 2008, and entitled "Analog-to-Digital Converter with DC Balanced Serialized Output." U.S. patent application Ser. No. 12/013,039 claims priority under 35 U.S.C. §119(e) from previous U.S. Provisional Patent App. No. 60/880,111, filed Jan. 11, 2007. All of these prior documents are incorporated herein by reference in their respective entireties.

BACKGROUND

Analog-to-digital converters ("ADC"s) are widely used in circuitry to convert an analog input voltage or current to a discrete digital signal, e.g., a signal represented by 1's and 0's. The signal having the 1's and 0's may be encoded in various ways, including binary, Gray code, or two's complimentary binary. The signal is then interpreted and decoded by other circuitry that uses the signal to perform specific functions.

Analog-to-digital conversion is useful in many technological applications, including televisions, digital cameras, cell phones, network devices, audio devices, and many other emerging technologies. Signal processing using digital signals is fast and accurate, and is increasingly used in these areas. Consequently, the use of ADCs has increased, and the need for faster, more accurate, and more reliable ADCs is helpful in continuing to improve these technologies.

BRIEF DESCRIPTION OF THE DRAWINGS

The accompanying drawings illustrate various embodiments of the principles described herein and are a part of the specification. The illustrated embodiments are merely examples and do not limit the scope of the claims.

FIG. 4 is a diagram of an illustrative serialization, piping, and balanced encoding of data in an analog to digital converter according to one exemplary embodiment of the principles described herein.

Throughout the drawings, identical reference numbers designate similar, but not necessarily identical, elements.

DETAILED DESCRIPTION

In many applications where an analog-to-digital converter ("ADC") is used, it may be desirable to have a balanced output, also referred to as a DC-balanced output. A balanced output is defined as having a total number of bits, either 1's or 0's, that are output or transmitted on any given data line from an ADC to be the same, such that the number of 1's in each data line equals the number of 0's in the same data line.

A balanced output may be useful because the output may more easily be isolated via optical, capacitive or magnetically coupled means. Balancing the output can help avoid voltage imbalance problems that may occur in some systems. For example, bit errors may be caused by long strings of 1's creating a DC level that charges coupling capacitors, bringing a signal input incorrectly down to a 0-level. Balancing the output may eliminate erroneous DC levels that can cause errors in such systems or components. In many systems, the accuracy of the ADC may be improved from isolation that breaks-up ground loops or enables placing the ADC away from a noisy digital environment. Other systems where a DC-balanced output is important include when the ADC output drives an inductive load, such as a cable. In these systems, DC balanced signals make it possible to simplify the circuitry that receives the signal and increases signal reliability.

The present specification discloses systems and methods of DC balancing an ADC output using, for example, 8B/10B encoding. 8B/10B encoding is commonly used in networking applications, but is not currently available or used in ADC applications. 8B/10B encoding alters data being transmitted such that it 10 bits are used to transmit 8 bits worth of data, where the 10 bits of encoded data have the same total number of ones (1's) and zeroes (0's) and can be used to reconstruct the original 8 bits exactly.

As used herein and in the appended claims, the term "bit" shall be broadly understood to mean a binary digit, either a "1" or a "0", used to represent a portion of information in a digital signal. As used herein and in the appended claims, the term "character" shall be understood to describe a group of bits associated with a specific symbol.

In the following description, for purposes of explanation, numerous specific details are set forth in order to provide a thorough understanding of the present systems and methods. It will be apparent, however, to one skilled in the art that the present systems and methods may be practiced without these specific details. Reference in the specification to "an embodiment," "an example" or similar language means that a particular feature, structure, or characteristic described in connection with the embodiment or example is included in at least that one embodiment, but not necessarily in other embodiments. The various instances of the phrase "in one embodiment" or similar phrases in various places in the specification are not necessarily all referring to the same embodiment.

Figure 1:
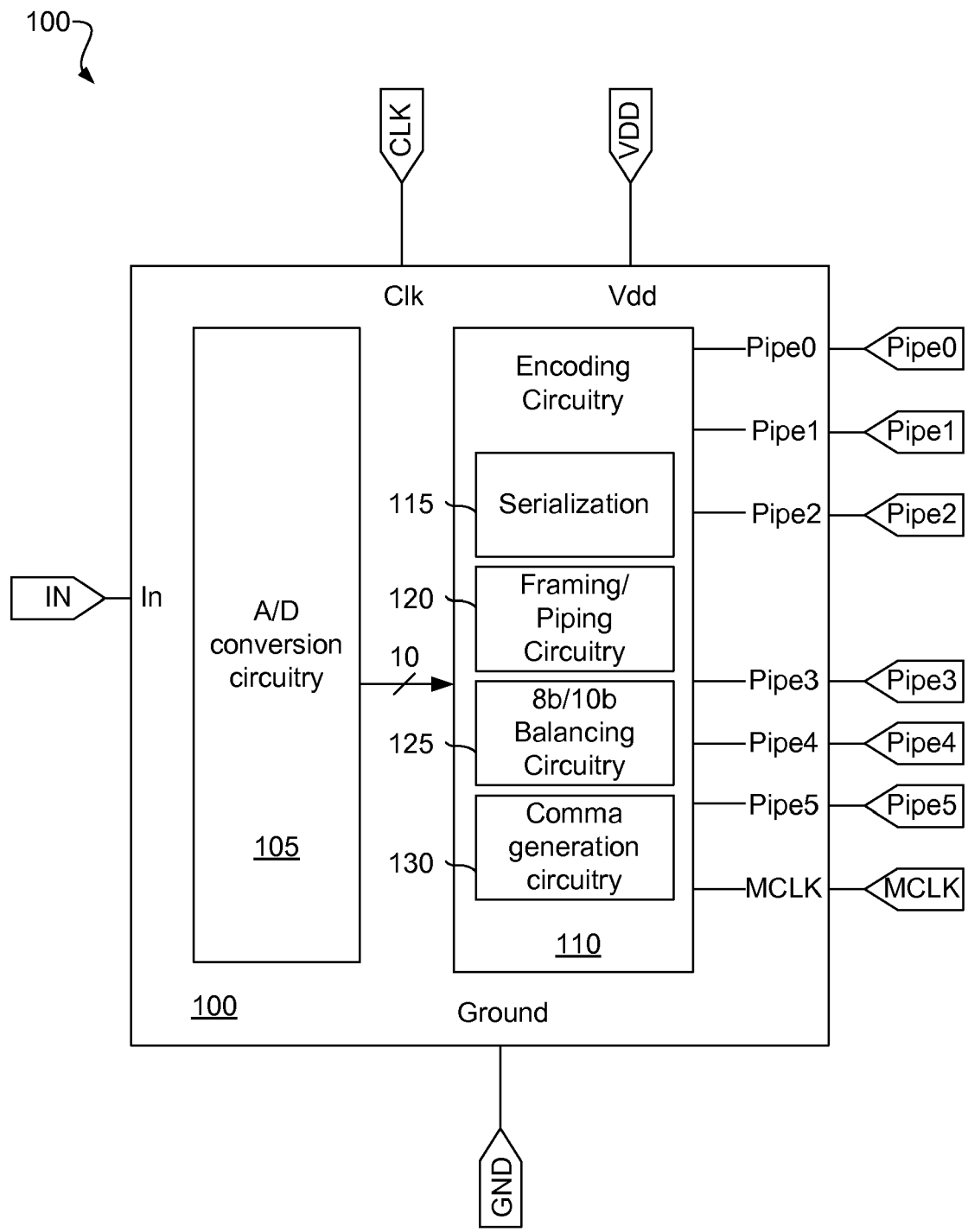
FIG. 1 is a block diagram of an illustrative analog to digital converter according to one exemplary embodiment of the principles described herein.

Referring now to FIG. 1, a block diagram of an illustrative analog to digital converter (100) is shown. The analog to digital converter (100) may be implemented entirely in hardware using logical circuitry. The illustrative analog to digital converter (100) includes multiple input/output nodes (IN, CLK, VDD, GND, Pipe0, Pipe1, Pipe2, Pipe3, Pipe4, Pipe5, and MCLK) configured to interface with circuitry external to the analog to digital converter (100) through a physical coupling of electrical conductors. Additional or fewer input/output nodes may be used than are shown in the example of FIG. 1, according to a particular application of the principles described herein.

The analog to digital converter (100) may include analog to digital conversion circuitry (105) configured to measure at least one attribute (e.g., voltage or current) of an analog signal received an input node (IN) and output a digital representation of the signal based on the measured attribute. For example, the analog to digital conversion circuitry (105) of the present example is configured to output a 10 bit representation of the signal. As such, the analog to digital conversion circuitry (105) includes 10 parallel output nodes, with each of the nodes configured to carry a voltage representative of one of the bits of the output of the analog to digital conversion circuitry (105).

Analog to digital conversion circuitry (105) is well-known in the art, and many different variations in analog to digital conversion circuitry (105) are known and employed in various electronics applications. Any suitable implementation of analog to digital conversion circuitry (105) having any suitable resolution and linearity may be used together with the principles described herein, as may best suit a particular application. Examples of suitable analog to digital conversion circuitry (105) include, but are not limited to, U.S. Patent Application Publication No. 2008/0048644 in the name of Hales et al.

The analog to digital converter (100) may also include encoding circuitry (110) that is configured to receive the parallel output of the analog to digital conversion circuitry (105). The encoding circuitry (110) may include serialization circuitry (115) configured to convert the parallel output of the analog to digital conversion circuitry (105) into a serial stream of bits on a single channel. As will be described in more detail in the following figures, the serial stream may be framed into multiple parallel output streams using framing/piping circuitry (120). These parallel output streams may then be balanced by converting the data in the streams into 8B/10B encoding using 8B/10B balancing circuitry (125). The analog to digital converter (100) may also include comma generation circuitry (130) configured to generate one or more predetermined binary synchronizing characters for separating blocks of framed data. In the present example, the 8B/10B parallel streams, and commas may be output to the Pipe0, Pipe1, Pipe2, Pipe3, Pipe4, and Pipe5 nodes together with a sampling clock signal (MCLK).

Figure 2:
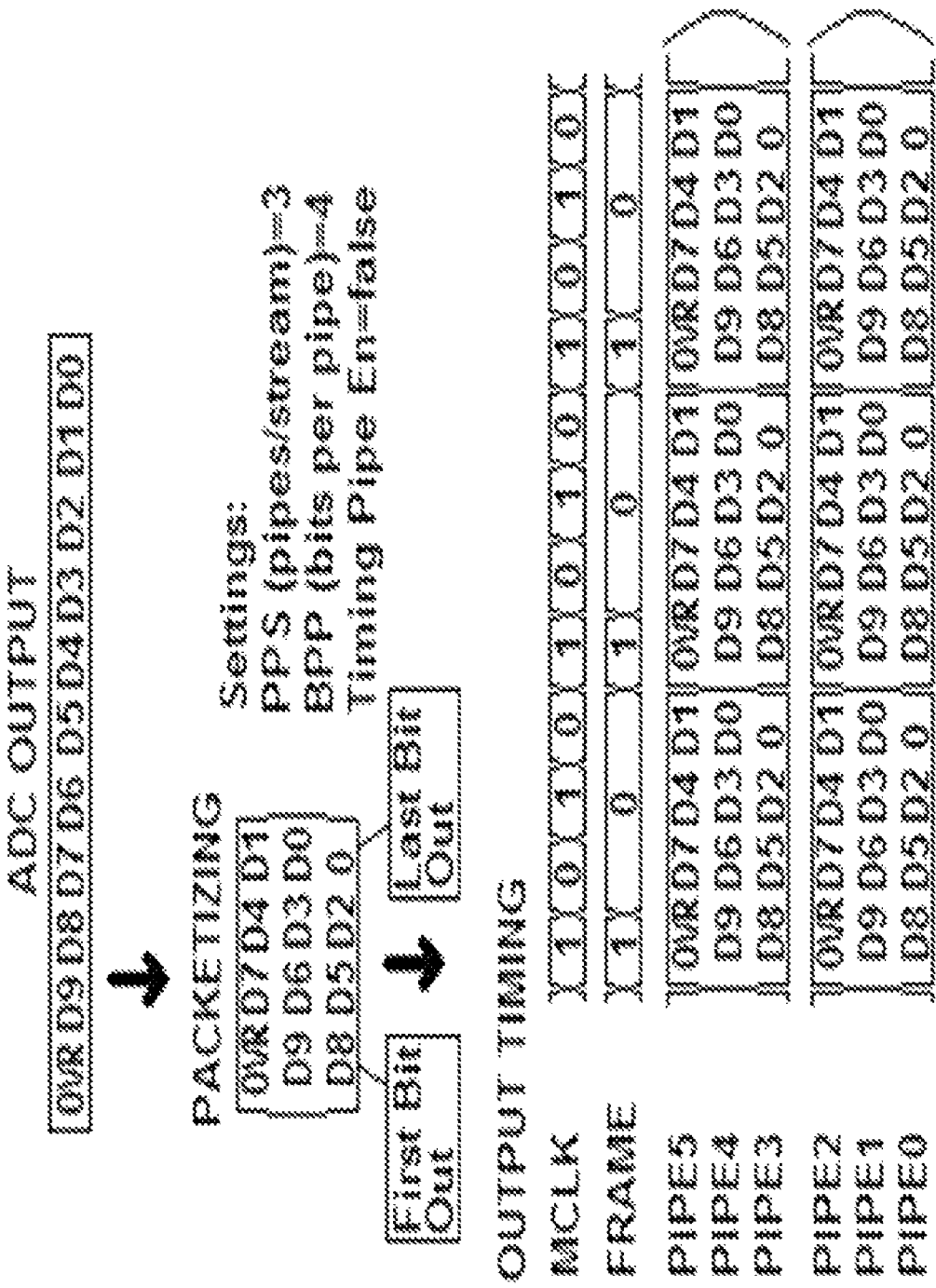
FIG. 2 is a diagram of illustrative serialization and piping of parallel data in an analog to digital converter according to one exemplary embodiment of the principles described herein.

Referring now to FIG. 2, a diagram is shown of an illustrative serialization and framing of data output from analog to digital conversion circuitry (105, FIG. 1). A trend in high speed converters is to output data on as few lines as possible. This is done by serializing data. For example, in an ADC outputting 10 bits of data (D0 to D9) plus an overflow bit (OVR), 11 parallel output paths would be required per sampling clock in order to output the data if each path only output one bit per clock cycle.

According to the present specification, each individual path may carry a pipe of data, such as in a single-ended signal or a differential pair of signals. A data stream can include one or more pipes for transferring simultaneous bits. Because current bus technologies can normally output data at much faster rates than the ADC conversion rate of analog-to-digital conversion circuitry (105, FIG. 1), data can be serialized and sent out over fewer pipes in each stream at a higher rate than would otherwise have been required without serializing the data. For example, when packetizing data, each packet may contain one character of a predetermined number of bits and an overflow bit. The packet may include other bits, such as a header to indicate where the first bit of the packet is. When bits are serialized, there are often two additional signals that must be sent with the data. These include a clock and a frame signal (MCLK and FRAME, respectively). MCLK provides a timing to capture individual bits in the data stream(s) and FRAME shows where a packet of data starts in a serialized data stream. Multiple channel ADCs can use the same frame and data clock for a plurality of output streams.

Figure 3:
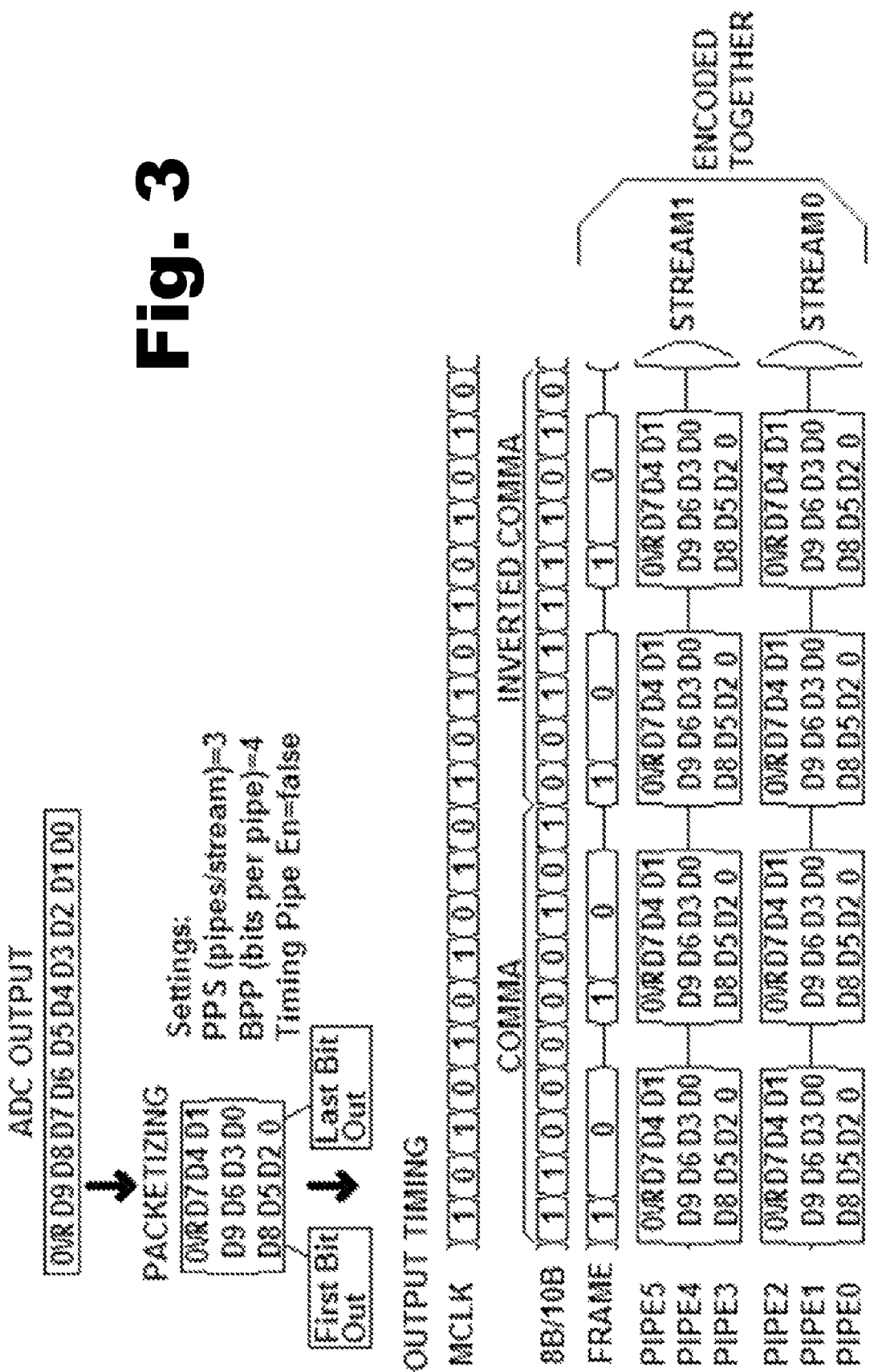
FIG. 3 is a diagram of illustrative serialization and piping of parallel data in preparation for 8B/10B encoding in an analog to digital converter according to one exemplary embodiment of the principles described herein.

Referring now to FIG. 3, synchronizing characters, ("commas") may be used to uniquely determine boundaries where encoded 8B/10B symbols start and stop. According to the example of FIG. 3, for every 8 unencoded data bits serialized, 10-bit times must be reserved because of the encoding overhead. FIG. 3 also shows that in the general case where data packets inside successive 8B/10B symbols may not always be aligned in the same place, a frame signal can be encoded together with the data, ensuring that the content of the packets can be interpreted correctly after being decoded. According to one embodiment, an 8B/10B encoded signal could be provided to alternately insert a comma (six 0's, four 1's) with an inverted comma (six 1's four 0's) to keep the DC balance. This would be synchronized with encoded pipes such that an 8B/10B decoder in a receiving device could use this signal to determine the locations of the encoded data packet boundaries.

In certain embodiments, a clock signal (MCLK) need not be transmitted separately from the 8B/10B data signal, as a suitable clock frequency may be recovered from the transmitted 8B/10B signal itself. This means that there is enough information in the signal itself that a separate clock doesn't need to be sent to time when to read data bits. Clock recovery may be done in 8B/10B encoding because of the frequent transitions between the 1 and 0 levels. Frequent transitions allow a receiver to generate a clock by approximating a frequency of the incoming signal, which is then aligning the phase of the generated clock with the phase of the incoming data streams by using a phase-locked loop (PLL) or other method. This 'self-timed data' is helpful in high-speed data streams because a small difference in length on any signal path can cause the timing to skew if there is no clock to indicate when to read the signal, resulting in bit errors otherwise.

An analog to digital converter (100, FIG. 1) using 8B/10B encoding for a balanced output consistent with the principles of the present specification may include enough pipes to only require 80% of the total output bandwidth for the packets. The other 20% may be used for the encoding overhead (e.g., extra two bits for every 8 data bits in 8B/10B encoding) used to maintain a balanced output.

One challenge to using 8B/10B encoding in an analog to digital conversion context consistent with these principles is that the encoding may be done using a data clock running at an integer multiple of 5/4 times the ADC sampling clock. It is far more desirable to have clocks at a power-of-2 integer multiple of the original clock because otherwise the clock may cause odd or fractional harmonics to appear in the ADC output. In order to successfully DC balance outputs from an ADC, the 8B/10B encoding may be used to generate a clock that is an integer power-of-2 multiplied by the sampling clock of the ADC, which will help eliminate odd or fractional harmonics from the ADC output.

One way to overcome this challenge is to internally serialize the data into enough pipes that there is less than 80% use of the output bandwidth. For example, FIG. 4 shows an 11-bit ADC word packetized into 4 separate output pipes, wherein each output pipe is 3-bits deep. If the serialized data is clocked out 4 times faster than the ADC produces each 11-bit word, then each internal serializing pipe is only 75% utilized (3 bits deep/4 bit times per sample). The 8B/10B encoding uses 80% of the available bandwidth, so it can output data slightly faster than the ADC produces the data. When the 8B/10B would have to start waiting for data from the ADC (resulting in stuffing empty bit values into the output stream), a comma character is inserted into the data stream.

Each 8B/10B character decoded results in eight bits of data that may contain bits from more or less than one ADC sample. Because of this it is helpful to constrain the comma character to be inserted only when the data following the comma character will be framed in a known position inside the eight bit data word. Thus the 8B/10B comma character frames not only the encoded 8B/10B symbols, but the data inside the symbol as well.

Three and six deep data streams serialized with x4 and x8 clocks respectively both produce conditions at which the entire available 8B/10B bandwidth is utilized for 15 consecutive 8B/10B characters. At this point, the 8B/10B encoder would begin waiting for the ADC data, so a comma character is inserted into the 16th packet. By timing the comma character such that the start of an ADC sample corresponds to the start of the first character after the comma character was sent, the receiver circuit can determine which bits in the decoded 8B/10B character are from which ADC sample. This may advantageously eliminate any need to output a 8B/10B timing stream or send a separate frame signal with the data, as done in the example of FIG. 3.

Similar schemes exist for data depths other than the example shown. Indeed, this scheme works with any original data stream with <80% bandwidth utilization. However, 3 and 6-bit deep data strikes an excellent balance of utilizing the full available bandwidth, while still enabling comma character insertion at reasonable intervals, with the added benefit of synchronizing the data without a separate framing stream, and at a reasonable serialization depth (multiplying MCLK greater than 8× the sampling clock of the ADC can be difficult).

The preceding description has been presented only to illustrate and describe embodiments and examples of the principles described. This description is not intended to be exhaustive or to limit these principles to any precise form disclosed. Many modifications and variations are possible in light of the above teaching.

What is claimed is:

1. An analog-to-digital converter (ADC) comprising:
analog to digital conversion circuitry configured to receive an analog signal and output a digital representation of said analog signal on a plurality of data lines; and
a balancing circuit configured to encode said digital representation of said analog signal on said data lines such that a total number of 1's transmitted on any said data line is equal to a total number of 0's transmitted on said data line, said balancing circuit being further configured to periodically insert a synchronizing character into said output; and, serialization circuitry configured to serialize a parallel output from said analog-to-digital conversion circuitry at a rate faster than is required for transmitting data encoded by said balancing circuit such that insertion of said synchronizing character does not affect a throughput of said encoded data.

2. The ADC of claim 1, wherein said analog to digital conversion circuitry is configured to produce said output in a data-stream immediately following said synchronizing character such that said synchronizing character also frames said output from said analog to digital conversion circuitry.

3. The ADC of claim 1, wherein said analog to digital conversion circuitry is configured to sample said analog signal according to a sampling clock; and said balancing circuit is configured to encode said digital representation using a clock that is an integer multiple of said sampling clock.

4. The ADC of claim 1, wherein said balancing circuit comprises an 8bit/10 bit (8B/10B) encoder.

5. The ADC of claim 4, wherein said encoder does not generate odd fractional harmonics.

6. A method of performing Analog-to-Digital Conversion comprising balancing an output of analog to digital conversion circuitry such that a total number of 1's and 0's transmitted on any of a number of output data lines is the same periodically inserting a synchronizing character into said output; and, serializing said output at a rate faster than is required for sending encoded data such that insertion of said synchronizing character does not affect throughput of said encoded data.

7. The method of claim 6, wherein said synchronizing character frames data content in said output.

8. The method of claim 6, further comprising clocking said output with a clock that is an integer multiple of a sampling clock used by said analog to digital conversion circuitry to sample an analog signal being converted to a digital signal.

9. The method of claim 6, wherein said balancing said output of said analog to digital conversion circuitry comprises encoding said output using 8B/10B encoding.

10. The method of claim 9, further comprising outputting a separate signal to indicate an 8B/10B character boundary.

* * * * *

UNITED STATES PATENT AND TRADEMARK OFFICE
CERTIFICATE OF CORRECTION

PATENT NO. : 7,928,884 B2  
APPLICATION NO. : 12/409256  
DATED : April 19, 2011  
INVENTOR(S) : Marcellus C. Harper It is certified that error appears in the above-identified patent and that said Letters Patent is hereby corrected as shown below:

Title Page,

Please list US Provisional application No: 60/880,111 filed on Jan. 11, 2007 in the related U.S. Application Data paragraph (63).

Signed and Sealed this  
Sixteenth Day of April, 2013

Teresa Stanek Rea  
*Acting Director of the United States Patent and Trademark Office*